(12) United States Patent
Alhawari et al.

(10) Patent No.: US 9,973,007 B2
(45) Date of Patent: May 15, 2018

(54) ENERGY MIXER

(71) Applicant: Khalifa University of Science and Technology, Abu Dhabi (AE)

(72) Inventors: Mohammad Radwan Alhawari, Abu Dhabi (AE); Baker Mohammad, Abu Dhabi (AE); Hani Hasan Mustafa Saleh, Abu Dhabi (AE); Mohammed Ismail Elnaggar, Abu Dhabi (AE)

(73) Assignee: Khalifa University of Science and Technology, Abu Dhabi (AE)

( * ) Notice: Subject to any disclaimer, the term of this patent is extended or adjusted under 35 U.S.C. 154(b) by 149 days.

(21) Appl. No.: 15/184,319

(22) Filed: Jun. 16, 2016

(65) Prior Publication Data
US 2017/0366012 A1    Dec. 21, 2017

(51) Int. Cl.
*H02J 4/00* (2006.01)
*H01L 35/02* (2006.01)
*H02N 2/18* (2006.01)

(52) U.S. Cl.
CPC ........... *H02J 4/00* (2013.01); *H01L 35/02* (2013.01); *H02N 2/181* (2013.01)

(58) Field of Classification Search
CPC .... H02J 4/00; H02J 7/32; H01L 35/02; H02N 2/181; H02M 7/217; H03F 1/0222; H03K 3/012
See application file for complete search history.

(56) References Cited

U.S. PATENT DOCUMENTS

| 9,197,143 B1* | 11/2015 | Townsend ............... H02J 1/108 |
| 2004/0100149 A1* | 5/2004 | Lai ........................... H02J 9/062 307/82 |
| 2011/0121659 A1* | 5/2011 | Cheng .................. H02M 7/217 307/104 |

OTHER PUBLICATIONS

Bandyopadhyay, Saurav et al., "Platform Architecture for Solar, Thermal, and Vibration Energy Combining With MPPT and Single Inductor," IEEE Journal of Solid-State Circuits, vol. 47, No. 9, Sep. 2012, 17 pages.

Carli, Davide et al., "An Effective Multi-Source Energy Harvester for Low Power Applications," Automation and Test in Europe Conference and Exhibition, Mar. 14-18, 2011, Grenoble, IEEE, 6 pages.

(Continued)

*Primary Examiner* — Jared Fureman
*Assistant Examiner* — Rafael Pacheco
(74) *Attorney, Agent, or Firm* — Withrow & Terranova, P.L.L.C.

(57) ABSTRACT

Disclosed is an energy mixer having a first active diode coupled between a first input node and an output node, and a second active diode coupled between a second input node and the output node. A first capacitor is coupled between the first input node and a dynamic node, and a second capacitor is coupled between the second input node and a third node. Switching circuitry is configured to selectively couple the dynamic node between a fixed voltage node and the second input node in response to a control signal provided by control circuitry. When an output voltage at the output node is within a first range, the dynamic node is coupled to the fixed voltage node and when the output voltage is within a lower voltage second range, the dynamic node is coupled to the second input node such that first capacitor and second capacitor are coupled in series.

23 Claims, 4 Drawing Sheets

(56) References Cited

OTHER PUBLICATIONS

Guilar, Nathaniel J. et al., "An Energy-Aware Multiple-Input Power Supply with Charge Recovery for Energy Harvesting Applications," Digest of Technical Papers, IEEE International Solid-State Circuits Conference, Mar. 2009, ISSCC 2009, pp. 298-300.
Lhermet, Hélène et al., "Efficient Power Management Circuit: From Thermal Energy Harvesting to Above-IC Microbattery Energy Storage," IEEE Journal of Solid-State Circuits, vol. 43, No. 1, Jan. 2008, pp. 246-255.

* cited by examiner

ENERGY MIXER

FIELD OF THE DISCLOSURE

The present disclosure relates to energy harvesting systems that harvest energy from multiple energy sources.

BACKGROUND

Traditional energy harvesting systems are inefficient in mixing energy generated from multiple sources, because traditional energy harvesting systems do not prevent system startup cycle in situations of insufficient voltage generation from one or more of the multiple sources. Moreover, traditional energy harvesting systems typically use diode devices for energy mixing, resulting in substantially energy wasteful voltage drops. What is needed is an energy mixer that overcomes the problems of intermittent availability of all energy sources at the same time to avoid a full startup cycle triggered by energy source voltage output drop, and energy wasteful diode voltage drops.

SUMMARY

The present disclosure provides an energy mixer having a first active diode coupled between a first input node and an output node, and a second active diode coupled between a second input node and the output node. A first capacitor is coupled between the first input node and a dynamic node, and a second capacitor is coupled between the second input node and a third node. Switching circuitry is configured to selectively couple the dynamic node between a fixed voltage node and the second input node in response to a control signal provided by control circuitry. When an output voltage at the output node is within a first range, the dynamic node is coupled to the fixed voltage node; and when the output voltage is within a lower voltage second range, the dynamic node is coupled to the second input node such that first capacitor and the second capacitor are coupled in series.

In an exemplary embodiment, a first energy harvester has a first voltage output that is coupled to the first input node, and a second energy harvester has a second voltage output that is coupled to the second input node. The exemplary embodiment also includes a first buck converter with a first converter input coupled to the output node, and a first converter output for providing a first buck voltage. A second buck converter with a second converter output is coupled to the output node with a second converter output for providing a second buck voltage. Other exemplary embodiments include additional energy harvesters and active diodes.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
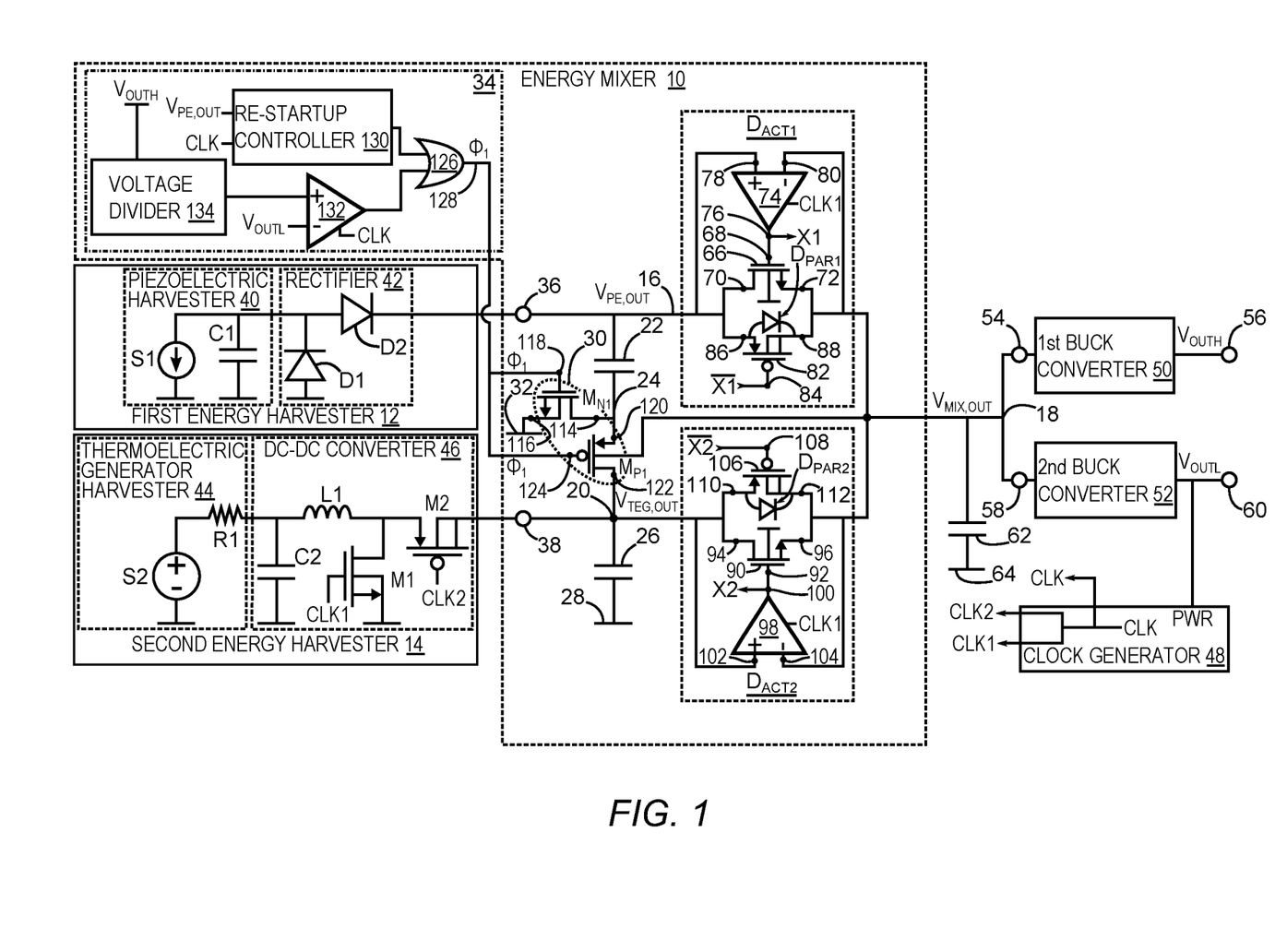
FIG. 1 is an exemplary embodiment of an energy mixer configured to mix energy gathered from two different energy harvesters in accordance with the present disclosure.

The present disclosure describes an energy mixer for multi-source energy harvesting. The disclosed energy mixer can be also be considered an energy combiner. FIG. 1 is an exemplary embodiment of an energy mixer 10 configured to mix energy gathered from a first energy harvester 12 and a second energy harvester 14 in accordance with the present disclosure. The energy mixer 10 includes a first active diode $D_{ACT1}$ coupled between a first input node 16 and an output node 18, and a second active diode $D_{ACT2}$ coupled between a second input node 20 and the output node 18. A first capacitor 22 is coupled between the first input node 16 and a dynamic node 24, and a second capacitor 26 is coupled between the second input node 20 and a third node 28. In this particular embodiment, the third node 28 is a fixed voltage node such as ground. The first capacitor 22 and the second capacitor 26 typically have capacitances in the microfarad range. However, it is to be understood that other capacitance ranges are within the scope of the present disclosure.

A first switching circuitry 30 is configured to selectively couple the dynamic node 24 between a fixed voltage node 32, typically ground, and the second input node 20 in response to a control signal $\varphi_1$. Control circuitry 34 is configured to provide the control signal $\varphi_1$ that has levels based upon two conditions. In a first condition, when an output voltage $V_{MIX,OUT}$ at the output node 18 is in a first range, the dynamic node 24 is coupled to the fixed voltage node 32. In a second condition, when the output voltage $V_{MIX,OUT}$ is in second range that is below the first range, the dynamic node 24 is coupled to the second input node 20 such that the first capacitor 22 and the second capacitor 26 are coupled in series.

In the exemplary embodiment of FIG. 1, the first energy harvester 12 has a first voltage output 36 coupled to the first input node 16, and the second energy harvester 14 has a second voltage output 38 coupled to the second input node 20. The second energy harvester 14 gathers a different form of energy than the first energy harvester 12.

In this example, the first energy harvester 12 includes a piezoelectric harvester 40 that generates an alternating current (AC) voltage that is converted into a direct current (DC) voltage by a rectifier 42. As depicted in FIG. 1, the piezoelectric harvester 40 is modeled by a source S1 and a capacitor C1, while the rectifier is modeled with traditional rectifying diodes D1 and D2.

The second energy harvester 14 includes a thermoelectric generator (TEG) harvester 44 and a DC-DC converter 46. Voltage generated by the TEG harvester 44 (i.e., $V_{TEG}$,out) is boosted by the DC-DC converter 46, which includes an inductor-capacitor circuit L1-C2 that is switched by a first converter transistor M1 driven by a first clock signal CLK1 and a second converter transistor M2 driven by a second clock signal CLK2. In this exemplary embodiment, the first clock signal and the second clock signal are derived from a master clock signal CLK provided by a clock generator 48.

In one embodiment, the energy mixer 10 further includes a first buck converter 50 and a second buck converter 52. The first buck converter 50 has a first converter input 54 that is coupled to the output node 18 and a first converter output 56 for providing a first buck voltage $V_{OUTH}$. The second buck converter 52 has a second converter input 58 that is coupled to the output node 18 and a second converter output 60 for providing a second buck voltage $V_{OUTL}$ that is lower in voltage than the first buck voltage $V_{OUTH}$. In one embodiment the first buck voltage $V_{OUTH}$ is between 1 V and 3.3 V, while the second buck voltage $V_{OUTL}$ is between 0.4 V and 0.9 V. In an exemplary embodiment, the clock generator 48 has a power input PWR coupled to the second converter output 60 so that the clock generator 48 is powered by the second buck voltage $V_{OUTL}$. However, it is to be understood that the clock generator 48 can also be powered by the first buck voltage $V_{OUTH}$ by coupling the power input PWR to the first converter output 56.

A mixed energy storage capacitor 62 is coupled between the output node 18 and a fixed voltage node 64 that is typically ground. The mixed energy storage capacitor 62 is charged with the voltage $V_{MIX,OUT}$ and typically has a capacitance in the microfarad range. However, it is to be understood that other capacitance ranges for the mixed energy storage capacitor 62 are within the scope of the present disclosure.

In greater detail, the first active diode $D_{ACT1}$ is made up of a first transmission gate transistor 66 having a first gate terminal 68, a first drain terminal 70 coupled to the first input node 16, and a first source terminal 72 coupled to the output node 18. A first clocked comparator 74 has a first comparator output 76 coupled to the first gate terminal 68, a first non-inverting input 78 coupled to the first input node 16, and a first inverting input terminal 80 coupled to the output node 18. A second transmission gate transistor 82 has a second gate 84 that receives an inverted version of a first comparator signal X1 that is output from the first comparator ouput 76, a second source terminal 86 coupled to the first input node 16, and a second drain terminal 88 coupled to the output node 18. A first parasitic diode $D_{PAR1}$ has an anode coupled to the first input node 16 and a cathode coupled to the output node 18. The first parasitic diode $D_{PAR1}$ provides an initial charging path between the first input node 16 and the output node 18.

The second active diode $D_{ACT2}$ is made up of a third transmission gate transistor 90 having a third gate terminal 92, a third drain terminal 94 coupled to the second input node 20, and a third source terminal 96 coupled to the output node 18. A second clocked comparator 98 has a second comparator output 100 coupled to the third gate terminal 92, a second non-inverting input 102 coupled to the second input node 20, and a second inverting input terminal 104 coupled to the output node 18. The clocked nature of the first clocked comparator 74 and the second clocked comparator 98 provide enhanced energy efficiency because the first comparator 74 and the second clocked comparator 98 are only active at clock transitions.

The second active diode $D_{ACT2}$ also includes a fourth transmission gate transistor 106 having a fourth gate terminal 108 that receives an inverted version of a second comparator signal X2 that is output from the second comparator output 100, a fourth source terminal 110 coupled to the second input node 20, and a fourth drain terminal 112 coupled to the output node 18. A second parasitic $D_{PAR2}$ has an anode coupled to the second input node 20 and a cathode coupled to the output node 18. The second parasitic diode $D_{PAR2}$ provides an initial charging path between the second input node 20 and the output node 18.

In greater detail, the first switching circuitry 30 has a first transistor $M_{N1}$ having a first current terminal 114 coupled to the dynamic node 24, a second current terminal 116 coupled to the fixed voltage node 32, and a first control terminal 118 coupled to the control circuitry 34 such that in response to a first state of the control signal $\varphi_1$, the dynamic node 24 is coupled to the fixed voltage node 32, and in response to a second state of the control signal $\varphi_1$, the dynamic node 24 is decoupled from the fixed voltage node 32.

The first switching circuitry 30 also has a second transistor $M_{P1}$ having a third current terminal 120 coupled to the dynamic node 24, a fourth current terminal 122 coupled to the second input node 20, and a second control terminal 124 coupled to the control circuitry 34 such that in response to the first state of the control signal $\varphi_1$, the dynamic node 24 is decoupled from the second input node 20, and in response to the second state of the control signal $\varphi_1$, the dynamic node 24 is coupled to the second input node 20 such that the first capacitor 22 and the second capacitor 26 are coupled in series.

In the exemplary embodiment of FIG. 1, the first transistor $M_{N1}$ is a negative-channel metal oxide semiconductor (NMOS) device and the second transistor $M_{P1}$ is a positive-channel metal oxide semiconductor (PMOS) device.

As such, the first state of the control signal $\varphi_1$ is a positive voltage that is sufficient to turn the first transistor $M_{N1}$ on and the second transistor $M_{P1}$ off. In contrast, the second state of the control signal $\varphi_1$ is a lower voltage that is sufficiently close to zero volts to ensure that the first transistor $M_{N1}$ is on and the second transistor $M_{P1}$ is off.

In greater detail, the control circuitry 34 includes an OR gate 126 having a signal output node 128 that transmits that control signal $\varphi_1$ to the first control terminal 118 of the first transistor $M_{N1}$ and the second control terminal 124 of the second transistor $M_{P1}$. The OR gate 126 receives input from a re-startup controller 130 that is responsive to the master clock signal CLK and the voltage level (i.e., $V_{PE}$,out) at the first input node 16. During transitions of the master clock signal CLK, the state of $V_{PE}$,out, either charged or discharged, is transmitted to the OR gate 126 by the re-startup controller 130. The OR gate 126 also receives input from a clocked re-startup comparator 132 that compares a fraction of the first buck voltage $V_{OUTH}$ with the second buck voltage $V_{OUTL}$. A voltage divider 134 provides the fraction of the first buck voltage $V_{OUTH}$. If the fraction of the first buck voltage $V_{OUTH}$ is greater than the second buck voltage $V_{OUTL}$, the clocked re-startup comparator 132 sends a high logic level to the OR gate 126, which in turn will drive the control signal $\varphi_1$ to a high logic level. Conversely, if the fraction of the first buck voltage $V_{OUTH}$ is lower than the second buck voltage $V_{OUTL}$, the clocked re-startup comparator 132 sends a low logic level to the OR gate 126, which in turn will drive the control signal $\varphi_1$ to the logic level of the re-startup controller 130.

Figure 2:
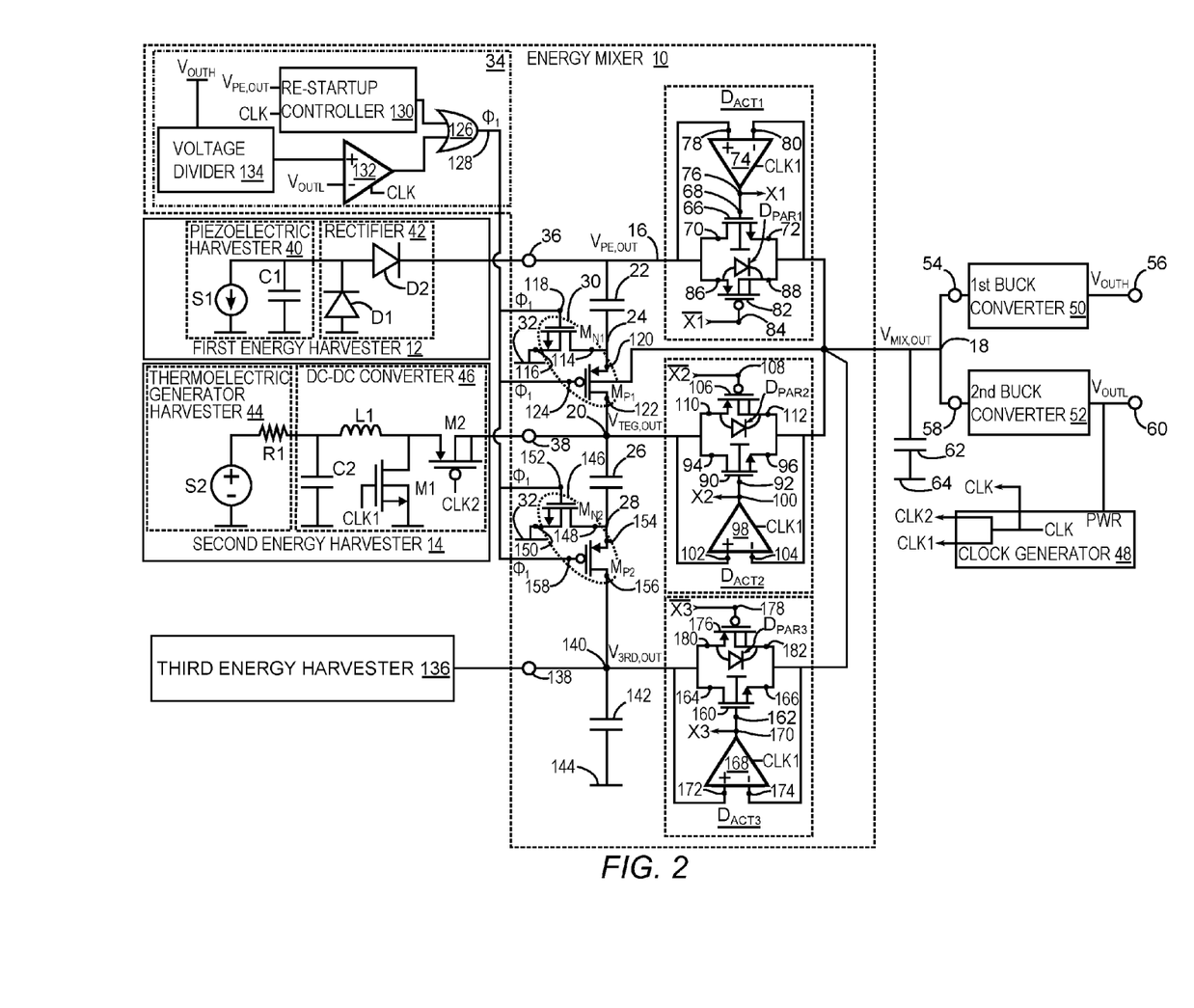
FIG. 2 is another exemplary embodiment of the energy mixer that includes a third energy harvester.

FIG. 2 is another exemplary embodiment of the energy mixer 10 that includes a third energy harvester 136 having third voltage output 138 coupled to a fourth node 140, and a third active diode $D_{ACT3}$ coupled between the fourth node 140 and the output node 18. A third capacitor 142 for storing energy gathered by the third energy harvester 136 is coupled between the fourth node 140 and a fifth node 144, which is typically ground. It is to be understood that the third energy harvester 136 can be an additional piezoelectric harvester or an additional thermoelectric generator harvester or any other type of energy harvester that converters one form of energy into electrical energy.

A second switching circuitry 146 has a third transistor $M_{N2}$ having a fifth current terminal 148 coupled to the third node 28, a sixth current terminal 150 coupled to the fixed voltage node 32, and a third control terminal 152 coupled to the signal output node 128 of the control circuitry 34 such that in response to the first state of the control signal $\varphi_1$, the third node 28 is coupled to the fixed voltage node 32, and in response to a second state of the control signal $\varphi_1$, the third node 28 is decoupled from the fixed voltage node 32.

The second switching circuitry 146 also includes a fourth transistor $M_{P2}$ having a seventh current terminal 154 coupled to the third node 28 and an eighth current terminal 156 coupled to the fourth node 140, and a fourth control terminal 158 coupled the to signal output node 128 of the control circuitry 34 such that in response to the first state of the control signal $\varphi_1$, the third node 28 is decoupled from the fourth node 140, and in response to the second state of the control signal $\varphi_1$, the third node 28 is coupled to the fourth node 140 such that the second capacitor 26 and the third capacitor 142 are coupled in series. It should be noted that in this exemplary embodiment depicted in FIG. 2, the first switching circuitry 30 in response to the second state of the control signal $\varphi_1$ will simultaneously couple the dynamic node 24 to the second input node 20 such that the first capacitor 22 will be coupled in series with the second capacitor 26. As a result, the second state of the control signal $\varphi_1$ will place all three of the first capacitor 22, the second capacitor 26, and the third capacitor 142 in series.

In the exemplary embodiment of FIG. 2, the third transistor $M_{N2}$ is a NMOS device and the fourth transistor $M_{P2}$ is a PMOS device. As such, the first state of the control signal $\varphi_1$ is a positive voltage that is sufficient to turn the third transistor $M_{N2}$ on and the fourth transistor $M_{P2}$ off. In contrast, the second state of the control signal $\varphi_1$ is a lower voltage that is sufficiently close to zero volts to ensure that the first transistor $M_{N2}$ is on and the fourth transistor $M_{P2}$ is off.

In greater detail, the third active diode $D_{ACT3}$ also includes a fifth transmission gate transistor 160 having a fifth gate terminal 162, a fifth drain terminal 164 coupled to the fourth node 140, a fifth source terminal 166 coupled to the output node 18, a third clocked comparator 168 having a third comparator output 170 coupled to the fifth gate terminal 162, a third non-inverting input 172 coupled to fourth node 140, and a third inverting input terminal 174 coupled to the output node 18.

The third active diode $D_{ACT3}$ also includes a sixth transmission gate transistor 176 having a sixth gate terminal 178 that receives an inverted version of a third comparator signal X3 that is output from the third comparator output 170, a sixth source terminal 180 coupled to the fourth node 140, a sixth drain terminal 166 coupled to the output node 18, a third parasitic diode $D_{PAR3}$ having an anode coupled to the fourth node 140, and a cathode coupled to the output node 18.

It is to be understood that the embodiment of the energy mixer 10 depicted in FIG. 2 is only exemplary and that additional energy harvesters may be accommodated by including an energy storing capacitor like the third capacitor 142, switching circuitry like the second switching circuitry 146, and an active diode like the third active diode $D_{ACT3}$ for each energy harvester. The additional energy harvesters, energy storage capacitors, switching circuitry, and active diodes are configured relative to the energy mixer 10 as described above.

Figure 3:
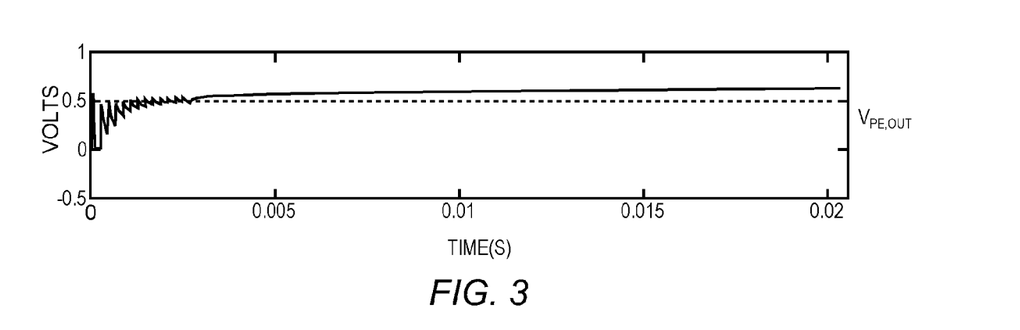
FIG. 3 is a simulation graph of voltage stored by a capacitor that stores energy gathered by a piezoelectric harvester coupled to the energy mixer of FIGS. 1 and 2 when switching circuitry that prevents re-start is inactive.
Figure 4:
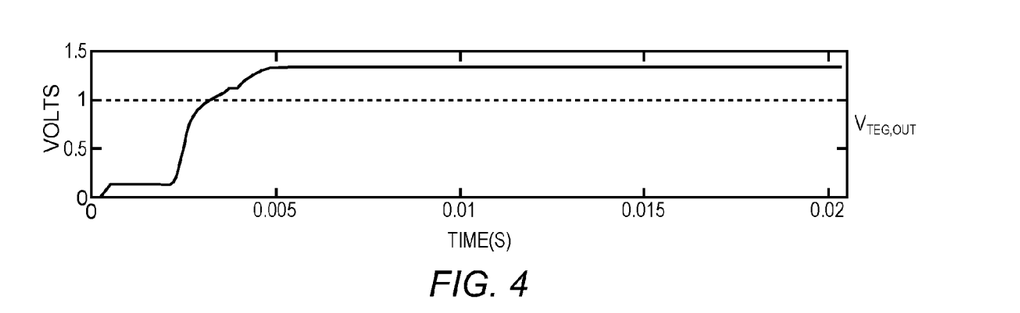
FIG. 4 is a simulation graph of voltage stored by a capacitor that stores energy gathered by a thermoelectric generator harvester coupled to the energy mixer of FIGS. 1 and 2 when switching circuitry that prevents re-start is inactive.

Referring back to FIG. 1 and forward to FIGS. 3-6, a description of operation for the energy mixer 10 follows. In operation and at initial startup of the energy mixer 10, the first capacitor 22, the second capacitor 26, and the mixed energy storage capacitor 62 are not charged. As an energy harvester that has passive energy conversion such as the piezoelectric harvester 40 of the first energy harvester 12 begins to gather energy, the first capacitor 22 will charge to the voltage $V_{PE,OUT}$. FIG. 3 is a simulation graph of voltage $V_{PE,OUT}$ stored by a capacitor that stores energy gathered by a piezoelectric harvester 40 when the first switching circuitry 30 is inactive. During initial startup, charges will transfer through the parasitic diode $D_{PAR1}$ from the first capacitor 22 to the mixed energy storage capacitor 62 because both the first transmission gate transistor 66 and the second transmission gate transistor 82 are off. At some point during the initial startup period, the voltage $V_{MIX,OUT}$ will be high enough to activate both the first buck converter 50 and the second buck converter 52 to generate the first buck voltage $V_{OUTH}$ and the second buck voltage $V_{OUTL}$, respectively. Both the first buck voltage $V_{OUTH}$ and the second buck voltage $V_{OUTL}$ are used to drive loads such as an external static random access memory (SRAM) and an external central processing unit (CPU) (not shown). At least one of the first buck voltage $V_{OUTH}$ and the second buck voltage $V_{OUTL}$ are used to power the clock generator 48, which in turn activates the DC-DC converter 46 to begin boosting voltage generated by the TEG harvester 44 by providing the first clock signal CLK1 and the second clock signal CLK2 to the DC-DC converter 46. Refer to FIG. 4, which is a simulation graph of the voltage $V_{TEG,OUT}$ stored by the second capacitor 26 when the first switching circuitry 30 is inactive. Notice that in this case, the second energy harvester 14 is providing full power before 5 milliseconds and at around 5 milliseconds the first energy harvester 12 begins the initial charging of the mixed energy storage capacitor 62.

Figure 5:
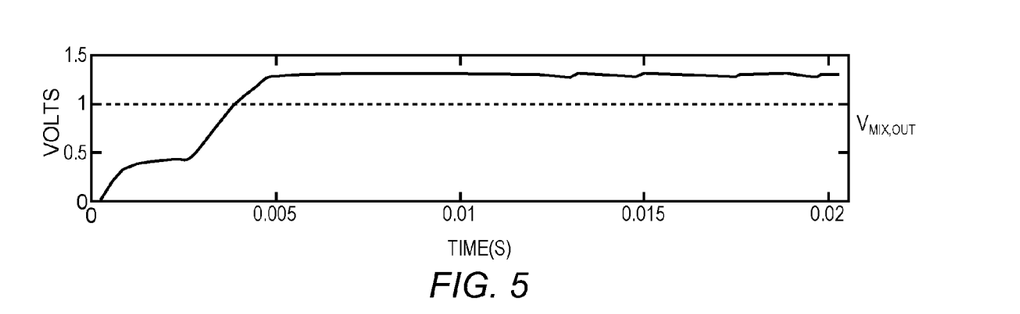
FIG. 5 is a simulation graph of voltage at the output node of the energy mixer of FIGS. 1 and 2 when switching circuitry that prevents re-start is inactive.

FIG. 5 is a simulation graph of the output voltage $V_{MIX,OUT}$ at the output node 18 when the first switching circuitry 30 is inactive. This graph represents normal operation for the energy mixer 10 wherein the output voltage $V_{MIX,OUT}$ is at a high enough voltage level to generate both $V_{OUTL}$ and $V_{OUTH}$. As a result of normal operation, the control signal φ1 will be at a logic 1 voltage level.

Figure 6:
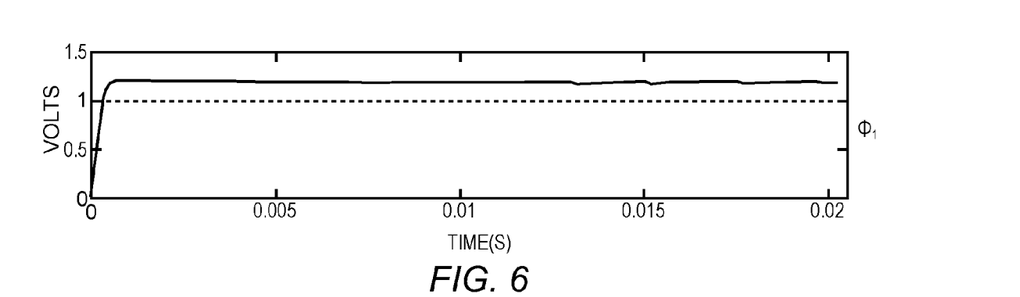
FIG. 6 is a simulation graph of a control signal generated by the energy mixer of FIGS. 1 and 2 when switching circuitry that prevents re-start is inactive.

FIG. 6 is a simulation graph of the control signal φ1 generated by the energy mixer 10 when the first switching circuitry 30 is inactive. During normal operation, the first switching circuitry 30 is inactive and the control signal φ1 remains at a constant logic 1 voltage level to ensure that the first capacitor 22 and the second capacitor 26 are separated and not placed in series while both the first energy harvester 12 and the second energy harvester 14 are both substantially contributing energy to the output voltage $V_{MIX,OUT}$.

In contrast, if one or the other of the first energy harvester 12 and the second energy harvester 14 has a substantial drop in energy contribution to the output voltage $V_{MIX,OUT}$, the clocked re-startup comparator 132 is triggered to output a logic 0. This action indicates that the output voltage $V_{MIX,OUT}$ is not at a voltage level high enough to generate to the first buck output voltage $V_{OUTH}$, but that the second buck output voltage $V_{OUTL}$ is still being generated. As a result, the first switching circuitry 30 becomes active and the control signal φ1 alternates between logic 1 and a logic 0.

Figure 7:
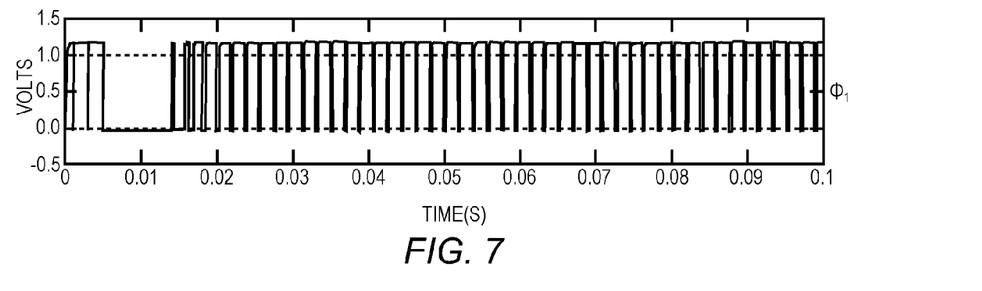
FIG. 7 is a simulation graph of the control signal generated by the energy mixer of FIGS. 1 and 2 when switching circuitry that prevents re-start is active.

FIG. 7 is a simulation graph of the control signal φ1 generated by the energy mixer 10 when the first switching circuitry 30 is active. During a logic 0, the first capacitor 22 and the second capacitor 26 are placed in series by the first switching circuitry 30 being active. As a result, the voltage $V_{PE}$,out at the first input node 16 and the voltage $V_{TEG,OUT}$ at the second input node 20 are summed together, which provides a high enough voltage level for the first active diode $D_{ACT1}$ to pass charges to the mixed energy storage capacitor 62. Once the charges are transferred, the first active diode $D_{ACT1}$ is turned off and the re-startup controller 130 forces the control signal $\varphi_1$ to be a logic 1 so that the first capacitor 22 and the second capacitor 26 are separated and are recharged by the first energy harvester 12 and the second energy harvester 14, respectively. However, the control signal $\varphi_1$ will alternate between a logic 1 and a logic 0 until the output voltage $V_{MIX,OUT}$ is at a voltage level high enough to resume normal operation by once again generating the first buck voltage $V_{OUTH}$.

Figure 8:
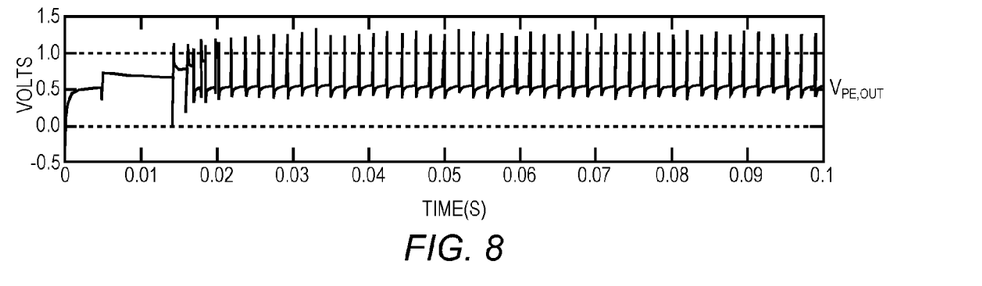
FIG. 8 is a simulation graph of voltage stored by the capacitor that stores energy gathered by the piezoelectric harvester coupled to the energy mixer of FIGS. 1 and 2 when switching circuitry that prevents re-start is active.
Figure 9:
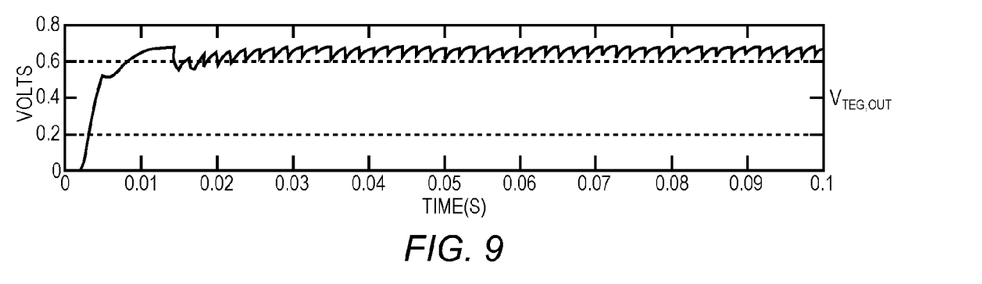
FIG. 9 is a simulation graph of voltage stored by the capacitor that stores energy gathered by the thermoelectric generator harvester coupled to the energy mixer of FIGS. 1 and 2 when switching circuitry that prevents re-start is active.
Figure 10:
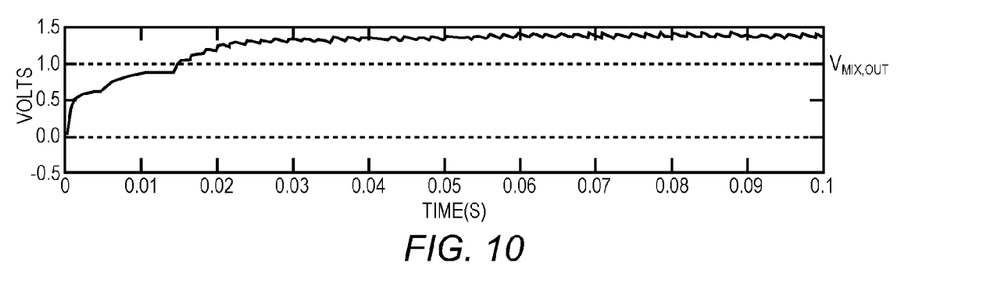
FIG. 10 is a simulation graph of voltage at the output node of the energy mixer of FIGS. 1 and 2 when switching circuitry that prevents re-start is active.

FIG. 8 is a simulation graph of the voltage $V_{PE,OUT}$ stored by the first capacitor 22 that stores energy gathered by the piezoelectric harvester 40 coupled to the energy mixer 10 when the first switching circuitry 30 is active. FIG. 9 is a simulation graph of the voltage $V_{TEG,OUT}$ stored by the second capacitor 26 that stores energy gathered by the TEG harvester 44 coupled to the energy mixer 10 when the first switching circuitry 30 is active. FIG. 10 is a simulation graph of the output voltage $V_{MIX,OUT}$ that eventually charges to the level of $V_{PE,OUT}+V_{TEG,OUT}$, which in this exemplary case is approximately equal to 1.4V.

The energy mixer 10 of FIG. 1 and FIG. 2 offers an integrated solution having an initial startup mode using a passive energy harvester, efficient energy mixing, and continued operation when energy levels gathered by one or more energy harvesters drops to a level that could not ordinarily allow continuous operation and thereby avoid energy wasting restarts.

Those skilled in the art will recognize improvements and modifications to the preferred embodiments of the present disclosure. All such improvements and modifications are considered within the scope of the concepts disclosed herein and the claims that follow.

What is claimed is:
1. An energy mixer comprising:
a first active diode coupled between a first input node and an output node;

a second active diode coupled between a second input node and the output node;
a first capacitor coupled between the first input node and a dynamic node;
a second capacitor coupled between the second input node and a third node;
first switching circuitry configured to selectively couple the dynamic node between a fixed voltage node and the second input node in response to a control signal; and
control circuitry configured to provide the control signal wherein:
when an output voltage at the output node is in a first range, the dynamic node is coupled to the fixed voltage node; and
when the output voltage is in a second range that is below the first range, the dynamic node is coupled to the second input node such that the first capacitor and the second capacitor are coupled in series.

2. The energy mixer of claim 1 wherein the third node is coupled to the fixed voltage node.

3. The energy mixer of claim 2 wherein the fixed voltage node is ground.

4. The energy mixer of claim 1 further comprising:
a first energy harvester having a first voltage output coupled to the first input node; and
a second energy harvester having a second voltage output coupled to the second input node.

5. The energy mixer of claim 4 wherein the first energy harvester and the second energy harvester gather different forms of energy.

6. The energy mixer of claim 1 further comprising:
a first buck converter having a first converter input coupled to the output node and a first converter output for providing a first buck voltage; and
a second buck converter having a second converter input coupled to the output node and a second converter output for providing a second buck voltage, and wherein the control signal is based on the first buck voltage.

7. The energy mixer of claim 6 wherein the control circuitry has a first sample voltage input coupled to the first converter output and a second sample voltage input coupled to the second converter output.

8. The energy mixer of claim 1 further comprising:
a first buck converter having a first converter input coupled to the output node and a first converter output for providing a first buck voltage on which the control signal is based;
a second buck converter having a second converter input coupled to the output node and a second converter output for providing a second buck voltage that is lower than the first buck voltage;
a first energy harvester having a first voltage output coupled to the first input node; and
a second energy harvester having a second voltage output coupled to the second input node.

9. The energy mixer of claim 8 wherein the first energy harvester is a piezoelectric harvester.

10. The energy mixer of claim 8 wherein the second energy harvester is a thermoelectric harvester.

11. The energy mixer of claim 1 wherein the first switching circuitry comprises:
a first transistor having a first current terminal coupled to the dynamic node, a second current terminal coupled to the fixed voltage node, and a first control terminal coupled to a signal output node of the control circuitry such that in response to a first state of the control signal, the dynamic node is coupled to the fixed voltage node, and in response to a second state of the control signal, the dynamic node is decoupled from the fixed voltage node; and
a second transistor having a third current terminal coupled to the dynamic node and a fourth current terminal coupled to the second node, and a second control terminal coupled to the control circuitry such that in response to the first state of the control signal, the dynamic node is decoupled from the second input node, and is response to the second state of the control signal, the dynamic node is coupled to the second input node.

12. The energy mixer of claim 1 further comprising:
a third active diode coupled between a fourth node and the output node;
a third capacitor coupled between the fourth node and a fifth node;
second switching circuitry configured to selectively couple the third node between the fixed voltage node and the fourth node in response to the control signal wherein;
when the output voltage at the output node is in the first range, the third node is coupled to the fixed voltage node; and
when the output voltage at the output node is in the second range that is below the first range, the third node is coupled to the fourth node such that the first capacitor, the second capacitor, and the third capacitor are coupled in series.

13. The energy mixer of claim 12 wherein the fifth node is coupled to the fixed voltage node.

14. The energy mixer of claim 12 further comprising:
a first buck converter having a first converter input coupled to the output node and a first converter output for providing a first buck voltage on which the control signal is based;
a second buck converter having a second converter input coupled to the output node and a second converter output for providing a second buck voltage that is lower than the first buck voltage;
a first energy harvester having a first voltage output coupled to the first input node;
a second energy harvester having a second voltage output coupled to the second input node; and
a third energy harvester having a third voltage output coupled to the fourth node.

15. The energy mixer of claim 14 wherein the first buck voltage is between 1 V and 3.3 V.

16. The energy mixer of claim 14 wherein the second buck voltage is between 0.4 V and 0.9 V.

17. The energy mixer of claim 12 wherein the first switching circuitry comprises:
a first transistor having a first current terminal coupled to the dynamic node, a second current terminal coupled to the fixed voltage node, and a first control terminal coupled to a signal output node of the control circuitry such that in response to a first state of the control signal, the dynamic node is coupled to the fixed voltage node, and in response to a second state of the control signal, the dynamic node is decoupled from the fixed voltage node; and
a second transistor having a third current terminal coupled to the dynamic node and a fourth current terminal coupled to the second input node, and a second control terminal coupled to the control circuitry such that in response to the first state of the control signal, the dynamic node is decoupled from the second input node, and in response to the second state of the control signal, the dynamic node is coupled to the second input node such that the first capacitor and the second capacitor are coupled in series.

18. The energy mixer of claim 17 wherein the second switching circuitry comprises:
a third transistor having a fifth current terminal coupled to the third node, a sixth current terminal coupled to the fixed voltage node, and a third control terminal coupled to the signal output node of the control circuitry such that in response to the first state of the control signal, the third node is coupled to the fixed voltage node, and in response to the second state of the control signal, the third node is decoupled from the fixed voltage node; and
a fourth transistor having a seventh current terminal coupled to the third node and an eighth current terminal coupled to the fourth node, and a fourth control terminal coupled to the control circuitry such that in response to the first state of the control signal, the third node is decoupled from the fourth node, and in response to the second state of the control signal, the third node is coupled to the fourth node such that the second capacitor and the third capacitor are coupled in series.

19. The energy mixer of claim 18 wherein the first transistor and the third transistor are both negative-channel metal oxide semiconductor (NMOS) devices and the second transistor and the fourth transistor are both positive-channel metal oxide semiconductor (PMOS) devices.

20. The energy mixer of claim 12 wherein the first active diode comprises:
a first transmission gate transistor having a first gate terminal, a first drain terminal coupled to the first input node, a first source terminal coupled to the output node, a first clocked comparator having a first comparator output coupled to the first gate terminal, a first non-inverting input coupled to the first input node, and a first inverting input terminal coupled to the output node; and
a second transmission gate transistor having a second gate terminal coupled to the first input node, a second source terminal coupled to the first input node, a second drain terminal coupled to the output node, and a first parasitic diode having an anode coupled to the first input node and a cathode coupled to the output node.

21. The energy mixer of claim 20 wherein the second active diode comprises:
a third transmission gate transistor having a third gate terminal coupled to the second input node, a third source terminal coupled to the second input node, a third drain terminal coupled to the output node, and a second parasitic diode having an anode coupled to the second input node and a cathode coupled to the output node; and
a fourth transmission gate transistor having a fourth gate terminal, a fourth drain terminal coupled to the second input node, a fourth source terminal coupled to the output node, a second clocked comparator having a second comparator output coupled to the fourth gate terminal, a second non-inverting input terminal coupled to the second input node, and a second inverting input terminal coupled to the output node.

22. The energy mixer of claim 21 wherein the third active diode comprises:
a fifth transmission gate transistor having a fifth gate terminal coupled to the fourth node, a fifth source terminal coupled to the fourth node, a fifth drain terminal coupled to the output node, a third parasitic diode having an anode coupled to the fourth node and a cathode coupled to the output node; and
a sixth transmission gate transistor having a sixth gate terminal, a sixth drain terminal coupled to the fourth node, a sixth source terminal coupled to the output node, a third clocked comparator having a third comparator output coupled to the sixth gate terminal, a third non-inverting input terminal coupled to the fourth node, and a third inverting input terminal coupled to the output node.

23. The energy mixer of claim 1 further comprising a mixed energy storage capacitor coupled between the output node and the fixed voltage node.

* * * * *